United States Patent [19]

McKee

[11] Patent Number: 4,915,807
[45] Date of Patent: Apr. 10, 1990

[54] METHOD AND APPARATUS FOR PROCESSING A SEMICONDUCTOR WAFER

[75] Inventor: Jeffrey A. McKee, Dallas, Tex.

[73] Assignee: Texas Instruments Incorporated, Dallas, Tex.

[21] Appl. No.: 251,623

[22] Filed: Sep. 29, 1988

[51] Int. Cl.[4] ............................................. C23F 4/00
[52] U.S. Cl. ............................... 204/192.32; 156/345; 156/643; 204/298.31; 204/298.33; 204/298.39
[58] Field of Search ....... 204/192.32, 298 E, 298 EG, 204/298 PP; 156/345, 643

[56] References Cited

U.S. PATENT DOCUMENTS

| | | | |
|---|---|---|---|
| 3,932,232 | 1/1976 | Labuda et al. | 204/192.32 |
| 4,424,096 | 1/1984 | Kumagai | 156/643 |
| 4,776,923 | 10/1988 | Spencer et al. | 156/643 |

FOREIGN PATENT DOCUMENTS 60-262972  12/1985  Japan ................................ 204/298

Primary Examiner—Aaron Weisstuch
Attorney, Agent, or Firm—B. Peter Barndt; James T. Comfort; Melvin Sharp

[57] ABSTRACT

An electrode (48) for generating molecular radicals to process a semiconductor wafer (52) is contained within an enclosure (56). A vacuum pump (58) is provided to evacuate the enclosure (56). A power source (50) powers plates (60), which are separated by grounded plates (62). A gas is introduced into the electrode (48) and is excited by the power source (50). The radicals created by the excitation pass through the electrode (48) to process the wafer (52). The alternately grounded and powered electrodes (60-62) cause electrons, created by the formation of the radicals, to travel back-and-forth between the plates. A circuitous path is provided through the electrode (48) by a grating (63) having protrusions (64-66) to further decrease the number of free electrons that escape, as well as to prevent the escape of ultraviolet light.

26 Claims, 2 Drawing Sheets

METHOD AND APPARATUS FOR PROCESSING A SEMICONDUCTOR WAFER

TECHNICAL FIELD OF THE INVENTION

This invention relates in general to semiconductor processing, and in particular to an electrode for exciting a reactive species for etching or depositing on a semiconductor wafer and method.

BACKGROUND OF THE INVENTION

Semiconductor processing typically requires several stages of surface etching and layer depositing to form circuits thereon. One device used to perform such etching and depositing is known as a parallel plate reactor. The parallel plate reactor resembles a typical bath-type showerhead in that it comprises a flat circular metallic disc with holes passing therethrough. Radicals are formed between the plates of the parallel plate reactor and directed through the holes therein onto a wafer below.

While the parallel plate reactor is an effective device for processing a wafer, the excitation of a gas creates electrons and ultraviolet light which then bombards the wafer, along with the plasma. Electrons and ultraviolet light generally have a negative effect on the process of depositing or etching the wafer and are therefore undesirable. The bombardment of the wafer by electrons reduces the processing selectivity, i.e., the ability of the radicals to remove or deposit only the desired materials is reduced. A parallel plate reactor typically produces selectivities in the range of 30 or 40 to 1.

Another device, created to reduce the bombarding of the wafer with electrons, is a microwave-induced plasma remote processor. With a remote processor, a metallic box is placed around a quartz tube and microwaves are generated to create a reactive species. A gas is pumped into the quartz tube and excited into a plasma state therein. Due to the shape of the quartz tube, many of the electrons are prevented from escaping the tube to bombard the wafer.

Unfortunately, most of the gases used to process a semiconductor wafer react with the quartz material from which the quartz tube is made. Thus, the excitation of the gas into radicals causes an increased deterioration of the quartz material by removing particles thereof which are carried with the radicals to be deposited onto the wafer. Any foreign particles such as quartz that are deposited on the wafer tend to mask the wafer during deposition or etching, which can cause the circuit being built to be destroyed.

Thus, a greater selectivity (300 to 1) is reached by the use of the remote processor, but due to the deposition of quartz particles, the benefit of increased selectivity is wasted. Thus, there is a need for a method and apparatus that has enhanced selectivity without depositing contaminants onto the wafer.

SUMMARY OF THE INVENTION

The present invention disclosed herein comprises a method and apparatus for generating radicals to process a silicon semiconductor wafer which greatly reduces or eliminates problems associated with prior processing devices. The present invention allows enhanced processing selectivity without damage to the wafer by the deposition of foreign material, or the bombardment by electrons and ultraviolet light.

In accordance with one aspect of the present invention, a semiconductor wafer processing apparatus is provided. An alternately powered and grounded electrode for receiving a reactive species is enclosed by a vacuum chamber. A power source provides power to the electrode to excite the reactive species within the electrode allowing a wafer to be processed.

In another aspect of the present invention, the electrode comprises a plurality of spaced-part grounded plates and a plurality of spaced-apart powered plates alternating with the grounded plates. The plates may comprise anodized aluminum or graphite and may be either concentric circular plates or flat parallel plates. A circuitous path may be provided through the electrode to further restrict the passage of electrons through the electrode to the wafer.

It is a technical advantage of the present invention that enhanced processing selectivity is possible through reduced electron and ultraviolet light bombardment of the wafer. It is a further technical advantage that there is a substantial reduction in the amount of contaminants deposited on the wafer.

BRIEF DESCRIPTION OF THE DRAWINGS

For a more complete understanding of the present invention and for further advantages thereof, reference is now made to the following Detailed Description, taken in conjunction with the accompanying Drawings in which.

DETAILED DESCRIPTION OF THE INVENTION

Figure 1:
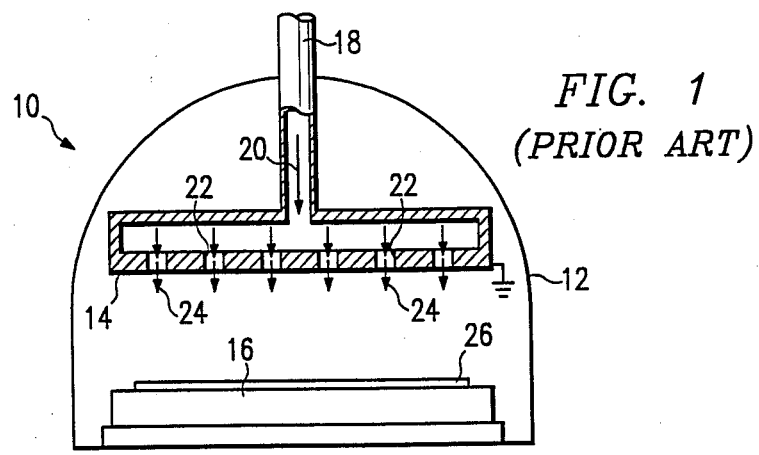
FIG. 1 is a cross-sectional view of a showerhead reactor constructed in accordance with the prior art.

Referring to FIG. 1, a parallel plate reactor, as is well known in the art, is generally identified by the reference numeral 10. The reactor 10 is enclosed within a vacuum chamber 12 and has a grounded anode 14 and a cathode 16 (cathode 16 is a powered electrode). The cathode 16, as is also well known in the art, comprises a multi-layered electrode.

A gas is introduced through the chamber 12 via inlet 18, as indicated by arrow 20, and is excited into a plasma state within the anode 14. The plasma passes through the anode 14 through holes 22 as shown by arrows 24 to process a wafer 26 which is positioned over cathode 16.

As the gas is excited, radicals are created with electrons and ultraviolet light also being released. The electrons and ultraviolet light pass through the anode 14 with the radicals and react with the wafer 26 counterproductive to the process being conducted thereon. Thus, it is usually possble to obtain a selectivity of no more than about 30 or 40 to 1 with a parallel plate reactor.

Figure 2:
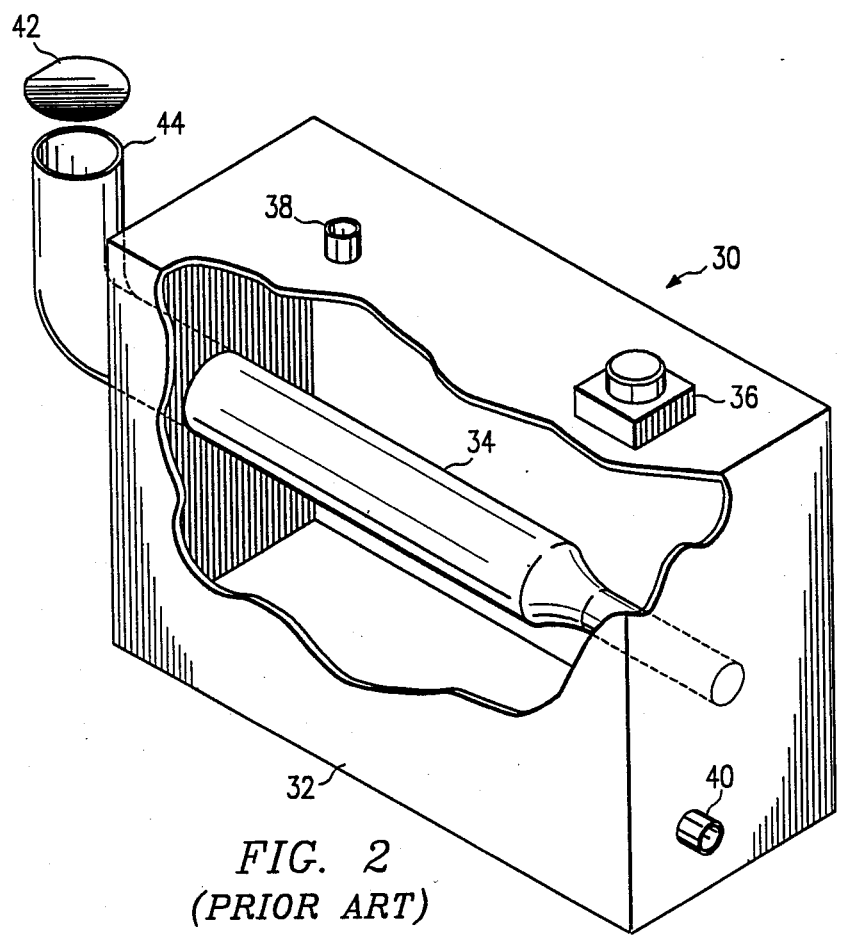
FIG. 2 is a cross-sectional view of a downstrream remote processor constructed in accordance with the prior art.

Referring to FIG. 2, a downstream remote reactor constructed in accordance with the prior art is generally identified by the reference numeral 30. The reactor 30 comprises a metallic container 32 with a quartz waveguide 34 passing therethrough. A magnetron 36, which is secured to the container 32, generates microwaves that provide the energy to excite a gas within the waveguide 34. An inlet 38 and an outlet 40 allow a cooling fluid (such as air) to circulate through the container 32. A wafer 42 proximate open end 44 is processed by the radicals formed within the waveguide 34.

Due to the design of the waveguide 34, bombardment of the wafer 42 by free electrons and ultraviolet light is significantly reduced. Unfortunately, due partly to the heat produced during the excitation phase, particles of the quartz waveguide 34 are removed from the walls thereof and travel with the radicals to be deposited on the wafer 42. Thus, while reactor 30 is able to provide enhanced processing selectivity (approximately 300 to 1), the circuits built on the wafer 42 may be destroyed by contaminating particles from the waveguide 34.

Figure 3:
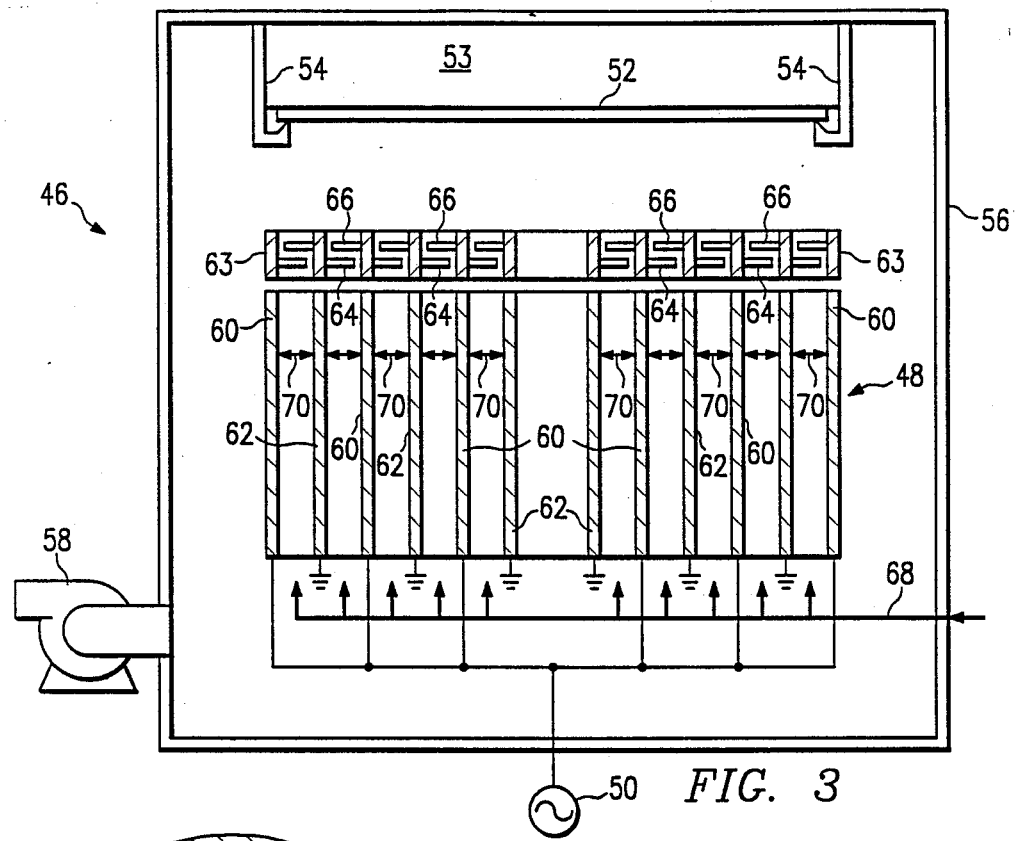
FIG. 3 is a cross-sectional view of an electrode processor constructed in accordance with the preferred embodiment of the present invention.

Referring to FIG. 3, a cross-sectional view of an isotropic reactor constructed in accordance with the preferred embodiment of the present invention is generally identified by the reference numeral 46. The reactor 46 comprises an alternately grounded and powered electrode 48. An alternating current power source 50 (such as an RF power generator capable of providing 13.5 megahertz) provides the power to electrode 48 to excite a gas. A wafer 52 is supported proximate the electrode 48 on a substrate 53 by any appropriate method such as arms 54. The reactor 46 is surrounded by an enclosure 56 which is appropriately sealed to allow a vacuum to be drawn therewithin, such as by a vacuum pump 58. A vacuum of one torr or less is usually necessary to excite the reactive species, but the actual pressure is dependant on the particular gas.

The electrode 48 comprises a plurality of alternately powered plates 60 and grounded plates 62. The plates 60-62 may comprise any appropriate material, for example, anodized aluminum or graphite. The electrode 48 may also be provided with a circuitous path such as by a grating 63 having overlapping protrusions 64 and 66. The grating 63 forms a floating potential and may comprise any suitable nonconductive material such as anodized aluminum, plastic or graphite.

In operation, a vacuum is drawn within enclosure 56 by pump 58 and a gas is introduced by any appropriate device (not shown) into the vacuum enclosure 56 and directed toward wafer 52 as indicated by arrows 68. The power source 50 is activated to power the plates 60 with alternating current, and the gas introduced to the electrode 48 is excited to form molecular radicals, electrons and ultraviolet light. Due to the alternately powered and grounded plates 60-62, the free electrons travel back-and-forth therebetween, as indicated by arrows 70.

The back-and-forth motion 70 of the electrons greatly reduces, but does not fully eliminate the passage of electrons through the electrode 48 to the wafer 52. Thus, processing selectivity is not as high as in a downstream remote processor (300 to 1), but is higher than with a parallel plate reactor (30 or 40 to 1).

If the grating 63 having protrusions 64-66 is utilized with electrode 48, a circuitous path is provided through which any electrons must travel before reaching slice 52, thus further reducing the escape of electrons therefrom. Another benefit from the protrusions 64-66 is the shielding effect provided thereby to the wafer 52 reducing the amount of ultraviolet light that escapes the electrode 48. Ultraviolet light may also hamper the processing of wafer 52 and is, therefore, undesirable. Thus, wafer 52 may be processed with enhanced selectivity and without contaminants interfering with the circuitry being built thereon.

Figure 4:
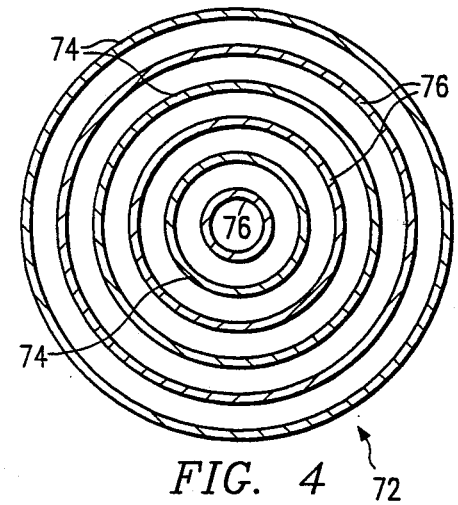
FIG. 4 is a top plan view of the preferred embodiment of an electrode according to the present invention.

Referring to FIG. 4, a top plan view of the preferred embodiment of an electrode 72 is illustrated. In the preferred embodiment, the electrode 72 comprises a plurality of flat plates formed into concentric circles. The plates comprise a plurality of spaced apart powered plates 74 which are each separated by a grounded plate 76 spaced apart therefrom. The space between each plate 74 and 76 depends upon the reactive species being used to process a wafer and, therefore, varies.

Figure 5:
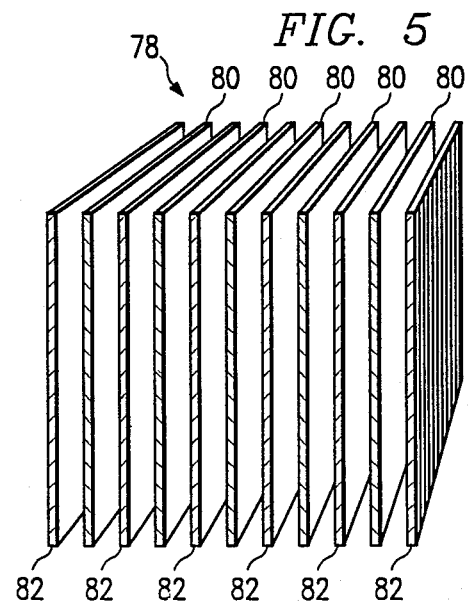
FIG. 5 is an isometric view of an alternate embodiment of an electrode of the present invention.

Referring to FIG. 5, an alternate embodiment of an electrode 78 is illustrated. The electrode 78 comprises a plurality of straight, flat, parallel powered electrodes 80 alternating with a plurality of straight, flat, grounded electrodes 82. The space between each plate 78 and 80 is, as described above, dependent upon the reactive species being used.

Although not shown, it is to be understood that an anisotropic reactor may be constructed utilizing the present invention. The simple addition of a cathode so as to place the wafer between the cathode and the alternately grounded and powered electrode would allow anisotropic processing of the wafer.

Although the present invention has been described with respect to a specific, preferred embodiment thereof, various changes and modifications may be suggested to one skilled in the art, and it is intended that the present invention encompass such changes and modifications which fall within the scope of the appended claims.

What is claimed is:

1. Apparatus for processing a semiconductor wafer, comprising:
   a plurality of spaced-apart first plates;
   means for applying electrical power to said first plates;
   a plurality of second plates spaced apart from and alternating with said first plates;
   means for directing a gas between said plates such that radicals are created to process the wafer but wherein electrons are inhibited from reaching the wafer;
   support means for holding the wafer proximate one end of the first and second plates, transversely to the gas flow between said plates.

2. The apparatus of claim 1, wherein said second plates are connected to a circuit ground.

3. The apparatus of claim 1, wherein said plates comprise concentric circular plates.

4. The apparatus of claim 1, wherein said plates comprise flat parallel plates.

5. The apparatus of claim 1, wherein said plates comprise anodized aluminum.

6. The apparatus of claim 1, wherein said plates comprise graphite.

7. The apparatus of claim 1, further including an RF power generator to power said first plates.

8. The apparatus of claim 1, further including a grid structure disposed between said plates and the wafer support means to provide a circuitous path to help retard the passage of electrons through said plates to the wafer.

9. The apparatus of claim 8, wherein said grid structure further includes means for retarding the passage of ultraviolet light created during the excitation of said reactive species.

10. The apparatus of claim 8, wherein said grid structure comprises overlapping protrusions.

11. An improved wafer processor, wherein the improvement comprises:
   a plurality of alternately arranged powered and grounded electrodes for receiving a gas;
   a power source for powering said powered electrodes;
   an enclosure for drawing a vacuum around said electrodes and a wafer, such that said gas is excited within the spaces between adjacent said electrodes to create radicals to process the wafer but to inhibit the passage of electrons to the wafer; and
   support means for holding the wafer proximate one end of said electrodes, transversely to the gas flow between said electrodes.

12. The improved processor of claim 11, wherein said electrodes comprise:
   a plurality of spaced-apart grounded plates; and
   a plurality of spaced-apart powered plates alternating with said grounded plates.

13. The improved processor of claim 12, wherein said plates comprise anodized aluminum.

14. The improved processor of claim 12, wherein said plates comprise graphite.

15. The improved processor of claim 11, wherein said electrodes comprise flat plates formed into concentric circles.

16. The improved processor of claim 11, wherein said electrodes comprise flat parallel plates.

17. The improved processor of claim 11, wherein said power source comprises an RF power generator.

18. The improved processor of claim 11, further including a circuitous path to restrict the passage therethrough of electrons to the wafer.

19. The improved processor of claim 18, wherein said circuitous path comprises overlapping protrusions.

20. A method for processing a semiconductor wafer, comprising the steps of:
   maintaining a plurality of spaced-apart first plates at ground potential;
   applying a second potential to a plurality of second plates spaced apart from and alternated with said first plates;
   injecting a gas between said first and second plates to excite said gas to create wafer processing radicals wherein said plates inhibit the passage of electrons to the wafer; and
   supporting the wafer proximate to one end of the first and second plates, the wafer being supported transversely to the flow of gas between said first and second plates.

21. The method of claim 20, further including the step of enclosing said plates and the wafer with a vacuum chamber.

22. The method of claim 20, wherein the step of applying a second potential comprises applying RF energy to said second plates.

23. The method of claim 20, further including the step of retarding the passage of said electrons through said plates to the wafer by requiring the electrons to follow a circuitous path through a grating disposed between the plates and the wafer.

24. A method for improving a semiconductor wafer processor, comprising the steps of:
   grounding a first plurality of spaced-apart plates;
   powering a second plurality of spaced-apart plates;
   alternating said grounded plates with said powered plates;
   injecting a gas between said alternating powered and grounded plates;
   exciting said gas within the space between adjacent said powered and grounded plates to form radicals for processing the wafer while inhibiting the passage of electrons to the wafer; and
   supporting a wafer proximate one end of said powered and grounded plates, the wafer being supported transversely to the gas flow within the spaces between said powered and grounded plates.

25. The method of claim 24, wherein the step of exciting comprises applying RF energy to said electrode.

26. The method of claim 24, further including the step of forming a circuitous path to retard the passage of electrons.

* * * * *